United States Patent
Lam

(10) Patent No.: US 9,204,582 B2
(45) Date of Patent: Dec. 1, 2015

(54) ELECTRONIC DEVICE PROTECTION

(71) Applicant: The Boeing Company, Chicago, IL (US)

(72) Inventor: Tai A. Lam, Kent, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/577,134

(22) Filed: Dec. 19, 2014

(65) Prior Publication Data

US 2015/0101860 A1  Apr. 16, 2015

Related U.S. Application Data

(60) Division of application No. 13/303,416, filed on Nov. 23, 2011, now Pat. No. 8,947,892, which is a continuation-in-part of application No. 12/857,413, filed on Aug. 16, 2010, now Pat. No. 8,325,495.

(51) Int. Cl.
*H05K 9/00* (2006.01)
*H01Q 15/00* (2006.01)

(52) U.S. Cl.
CPC ........... *H05K 9/0086* (2013.01); *H01Q 15/006* (2013.01); *H01Q 15/0013* (2013.01)

(58) Field of Classification Search
USPC ......... 361/753, 767, 777, 803, 816, 818, 799; 174/350, 357, 387, 390, 392; 248/457, 248/458, 423.5, 423.7, 423.8, 423.9; 343/909
See application file for complete search history.

(56) References Cited

U.S. PATENT DOCUMENTS

| | | | |
|---|---|---|---|
| 4,922,253 A | 5/1990 | Nathanson et al. | |
| 5,214,432 A | 5/1993 | Kasevich et al. | |
| 6,054,647 A | 4/2000 | Ridener | |
| 6,096,979 A | 8/2000 | Kyle | |
| 6,191,367 B1 | 2/2001 | Hayashi | |
| 6,218,978 B1 | 4/2001 | Simpkin et al. | |
| 6,232,931 B1 | 5/2001 | Hart | |

(Continued)

FOREIGN PATENT DOCUMENTS

| | | |
|---|---|---|
| DE | 69219993 T2 | 12/1997 |
| EP | 1137102 A2 | 9/2001 |

OTHER PUBLICATIONS

B.G. Chae et al, "Abrupt matal-insulator transition observed in VO2 thin films induced by a switching voltage pulse," Physica B, 369; Jul. 2005; 4 pages.
European Search Report for Application No. 1117695.1, dated Nov. 18, 2011, 6 pages.
"Timing Nature's Fastest Optical Shutter," PHYSorg.com, http://www.physorg.com/news3629.html; Apr. 7, 2005; 3 pages.

(Continued)

*Primary Examiner* — Hung S Bui
(74) *Attorney, Agent, or Firm* — Toler Law Group, PC

(57) ABSTRACT

A method includes permitting a first signal having a first electromagnetic waveform to pass through an apparatus. The method further includes blocking a second signal having a second electromagnetic waveform at the apparatus, wherein the second electromagnetic waveform is different than the first electromagnetic waveform. The apparatus includes a non-conductive substrate and a plurality of cells including conductive members coupled to the non-conductive substrate, where the conductive members are arranged to form a first discontinuous mesh, where regions between the conductive members of the first discontinuous mesh include a phase change material, and where the phase change material undergoes a phase transition from substantially non-conductive to substantially conductive.

20 Claims, 11 Drawing Sheets

(56) References Cited

U.S. PATENT DOCUMENTS

| | | |
|---|---|---|
| 6,448,492 B1 | 9/2002 | Okada et al. |
| 6,512,487 B1 | 1/2003 | Taylor et al. |
| 6,927,745 B2 | 8/2005 | Brown et al. |
| 6,989,487 B2 | 1/2006 | Hou |
| 7,095,627 B2 | 8/2006 | Yokota |
| 7,145,512 B2 | 12/2006 | Metz |
| 7,277,300 B2 | 10/2007 | Sakamoto et al. |
| 7,339,120 B2 | 3/2008 | Notohara et al. |
| 7,420,524 B2 | 9/2008 | Werner et al. |
| 7,679,563 B2 | 3/2010 | Werner et al. |
| 7,931,518 B2 | 4/2011 | Kotsubo et al. |
| 8,325,495 B2 | 12/2012 | Lam et al. |
| 2002/0058490 A1* | 5/2002 | Sorrells et al. ............... 455/313 |
| 2004/0263420 A1 | 12/2004 | Werner et al. |
| 2006/0051592 A1 | 3/2006 | Rawlings et al. |
| 2006/0214885 A1* | 9/2006 | Jung et al. ....................... 345/63 |
| 2007/0266886 A1 | 11/2007 | En et al. |
| 2008/0198100 A1* | 8/2008 | Itokawa et al. .................. 345/60 |
| 2008/0238822 A1* | 10/2008 | Lee .................................. 345/60 |
| 2009/0218310 A1 | 9/2009 | Zu et al. |

OTHER PUBLICATIONS

Aurelian, C. et al., "Exploiting the Semiconductor-Metal Phase Transition of VO2 Materials: A Novel Direction Towards Tuneable Devices and Systems for RF-Mircrowave Applications," Advanced Microwave and Millimeter Wave Technologies: Semiconductor Devices; Mar. 1, 2010; pp. 35-56.

Kim, J. et al., "2.45 GHz Microwave-Excited Atmospheric Pressure Air Microplasmas Based on Microstrip Technology," Applied Physics Letter 86, May 5, 2005, 3 pages.

Lessner, G., "Stochastic Statistical Mechanics and Electric Conductivity of a Cold Plasma," Physics Letter A 221, Oct. 7, 1996, pp. 293-300.

Ogata, K. et al., "Characterizations of Strip-Line Microwave Micro Atmospheric Plasma and Its Application to Neutralization," Journal of Applied Physics 106, Jul. 16, 2009, 6 pages.

Otteni, G., "Plane Wave Reflection From a Rectangular-Mesh Ground Screen," IEEE Transactions on Antennas and Propagation, vol. AP-21, No. 6, Nov. 1973, pp. 843-851.

Yang, Z. et al., "Oxide Electronics Utilizing Ultrafast Metal-Insulator Transitions," Annual Review of Materials Research, vol. 41, http://www.annualreviews.org; Mar. 30, 2011; pp. 337-369.

* cited by examiner

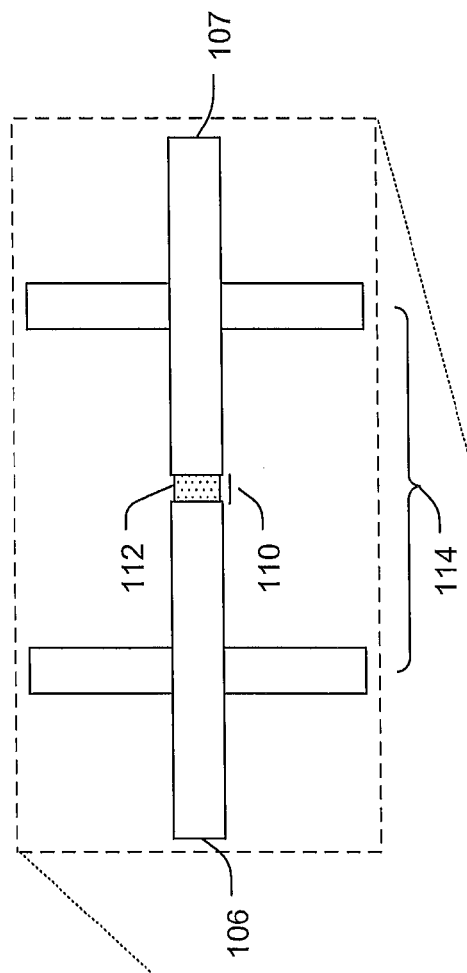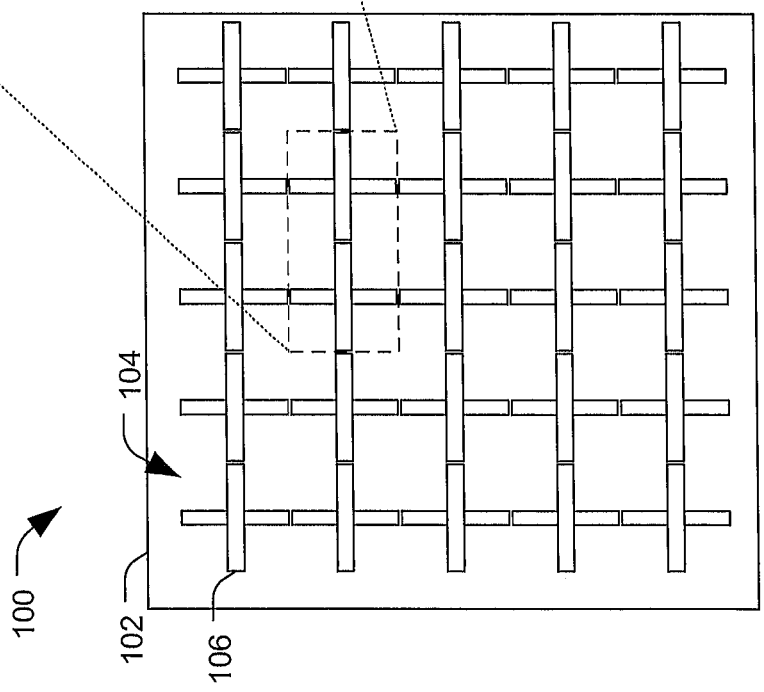

Non-Conductive phase

Conductive phase

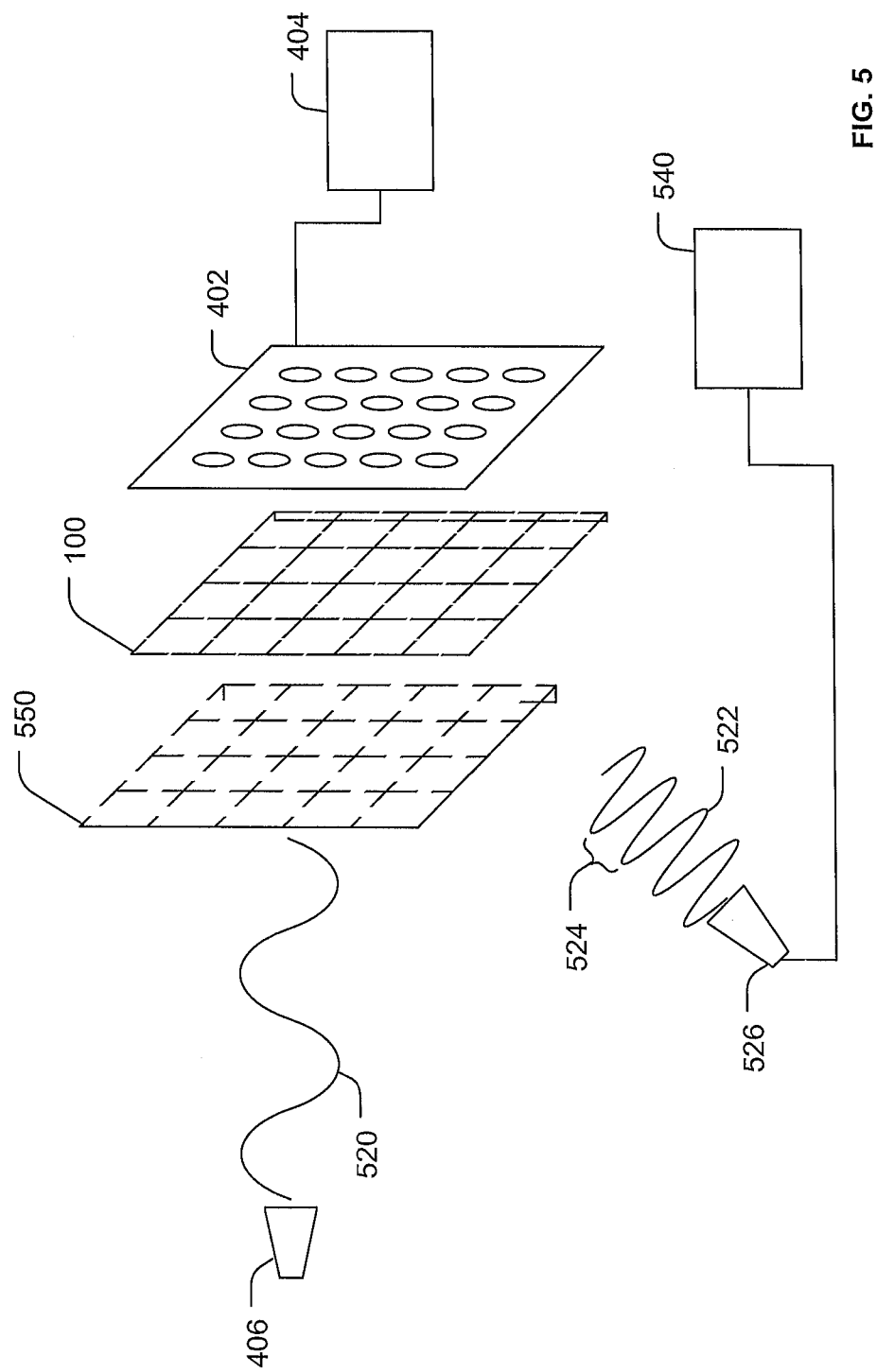

ELECTRONIC DEVICE PROTECTION

CLAIM OF PRIORITY

The present application claims priority from, and is a divisional application of, U.S. patent application Ser. No. 13/303,416, filed Nov. 23, 2011, which is a continuation-in-part of U.S. patent application Ser. No. 12/857,413 (now issued as U.S. Pat. No. 8,325,495), filed Aug. 16, 2010, the contents of each of which are incorporated by reference herein in their entirety.

FIELD OF THE DISCLOSURE

The present disclosure is generally related to apparatus, systems and methods for electronic device protection.

BACKGROUND

Low-noise amplifiers in antennas and direction arrival estimation systems may be susceptible to high-power microwave attacks or interference from other devices located near the low-noise amplifiers. In phased array antenna systems and certain other communication systems, silicon carbide (SiC)-based limiters may be placed in-line to provide protection against high-power signals. For example, the SiC-based limiters may be placed between an antenna and the low-noise amplifiers to reduce the amount of power that goes through the low-noise amplifiers. The SiC-based limiters may be integrated at each element of a phased array antenna. Since phased array antennas may include thousands of elements, placing limiters at each element may introduce significant costs and complexity.

Another method of protecting electronic devices, such as low-noise amplifiers, from exposure to high-power electromagnetic radiation, e.g., high-power microwave radiation, may be to place a switchable transistorized mesh system in front of an antenna array. The switchable transistorized mesh system may include conductors arranged in a mesh with discontinuities. A transistor may be present at each discontinuity. When the transistors are off (e.g., behaving like an open switch), electromagnetic energy may pass through the mesh. When the transistors are on (e.g., behaving like a closed switch), the mesh is effectively continuous, and electromagnetic energy may be reflected from the mesh. Since each transistor is provided with power for switching, significant complexity may be added by using such a switchable transistorized mesh system. Further, switching time of the transistors may add an unacceptable delay.

SUMMARY

Apparatus, systems and methods for electronic device protection are provided. A particular apparatus includes a non-conductive substrate and a plurality of cells including conductive members coupled to the non-conductive substrate. The conductive members are arranged to form a first discontinuous mesh. Regions between the conductive members of the first discontinuous mesh include a phase change material. The phase change material undergoes a phase transition from substantially non-conductive to substantially conductive responsive to a change of energy.

A particular system includes an electronic device and a protection apparatus to protect the electronic device by selectively blocking electromagnetic radiation. The protective apparatus includes a non-conductive substrate and a plurality of cells including conductive members coupled to the non-conductive substrate. The conductive members are arranged to form a first discontinuous mesh. Regions between the conductive members of the first discontinuous mesh include a phase change material. The phase change material undergoes a phase transition from substantially non-conductive to substantially conductive responsive to a first electromagnetic waveform.

A particular method includes permitting a first signal having a first electromagnetic waveform to pass through an apparatus and blocking a second signal having a second electromagnetic waveform at the apparatus. The second electromagnetic waveform is different than the first electromagnetic waveform. The apparatus includes a non-conductive substrate, a discontinuous mesh of conductive members, and a phase change material disposed between the conductive members of the discontinuous mesh. The phase change material undergoes a phase transition from substantially non-conductive to substantially conductive at least partially responsive to the second electromagnetic waveform.

The features, functions, and advantages that have been described can be achieved independently in various embodiments or may be combined in yet other embodiments, further details of which are disclosed with reference to the following description and drawings, which are not to scale.

BRIEF DESCRIPTION OF THE DRAWINGS

FIG. 1A is a plan view of a particular embodiment of an apparatus to protect an electronic device;

FIG. 1B is a view of a particular portion of the apparatus of FIG. 1A;

FIG. 5 is a perspective view of a second particular embodiment of a system to protect an electronic device;

DETAILED DESCRIPTION

Figure 2A:
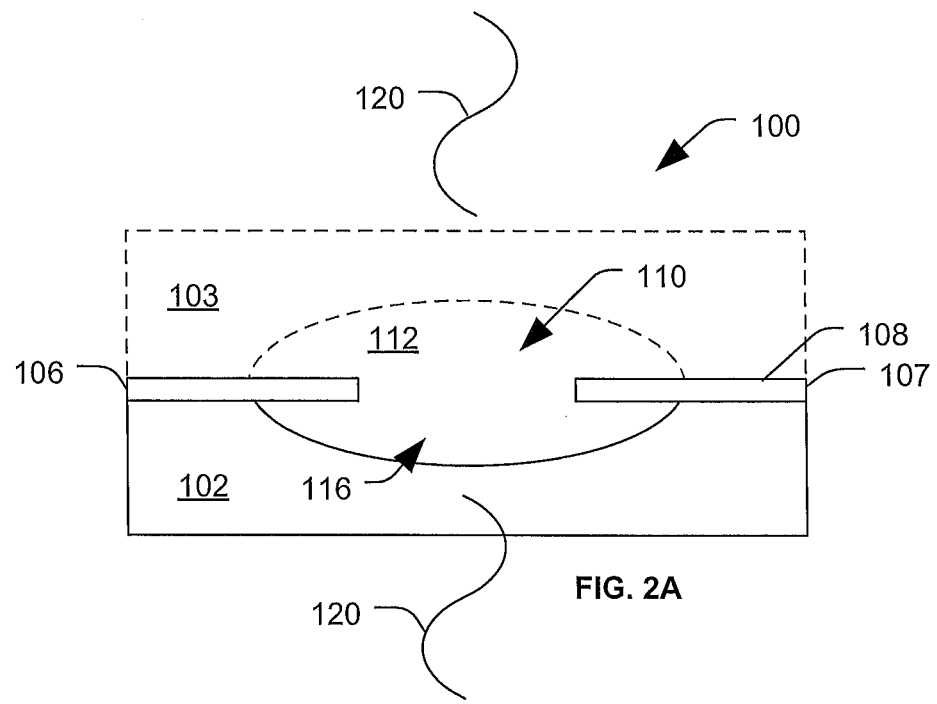
FIG. 2A is a sectional view of a gap between cells of a first embodiment of the apparatus of FIG. 1A in a first operational state.

Embodiments disclosed herein include an inexpensive low-loss, wide-bandwidth, radio frequency (RF) shutter for use in protecting electronic devices, such as low-noise amplifiers and other communication systems. The RF shutter may include conductive elements arranged in a mesh. The conductive elements of the mesh may have a plurality of intersections. The conductive elements may be separated by a gap or a phase change material. For example, an area between the conductive elements may include discontinuities formed by a phase change material or phase change materials. The phase change material may be substantially non-conductive in a first phase and substantially conductive in a second phase. As used herein, a substantially non-conductive material refers to a material that has few mobile charge carriers, such as an insulator or dielectric. Thus, a substantially non-conductive material has a high dielectric constant. In contrast, a substantially conductive material herein refers to a material with an abundance of moveable charge carriers, such as a metal or plasma. To illustrate, the phase change material may be a material such as vanadium dioxide, which undergoes a metal-insulator phase transition. In another example, the phase change material may be a gas that undergoes a gas-to-plasma phase transition. The phase transition from the first phase to the second phase may be triggered responsive to particular electromagnetic waveforms.

The discontinuities between the conductive elements enable the discontinuous mesh to be transparent to certain electromagnetic waves (e.g., relatively low-power, low-frequency signals). However, in the presence of other electromagnetic waves (e.g., relatively high-power or high-frequency signals), the phase change material in the discontinuities may become conductive. For example, a gas in microgaps between the conductive elements may form a plasma. The plasma is conductive and electrically bridges the microgap causing the mesh to behave as a continuous mesh and to reflect the electromagnetic waves. In another example, an insulator-metal phase change material between the conductive elements may undergo a phase transition from an insulator (i.e., substantially nonconductive) phase to a metal (i.e., substantially conductive) phase, thereby electrically bridging the conductive elements.

In a particular embodiment, when a plasma is formed between the conductive elements, the plasma may be a cold plasma. A cold plasma may be only partially ionized. For example, in a cold plasma as little as about 1% of a gas may be ionized. This is in contrast to a thermal or hot plasma, in which a much higher proportion of the gas may be ionized. When an insulator-metal phase change material is used, the insulator-metal phase change material may include a dopant or other material that changes phase transition properties of the insulator-metal phase change material. For example, a dopant may be added to adjust conditions at which the insulator-metal phase change material undergoes the phase transition.

Electronic devices protected by the RF shutter may retain normal operation (e.g., transmission and reception of relatively low-power, low-frequency signals) during periods between exposures to relatively high-power or high-frequency signals. However, during exposure to the high-power or high-frequency signals, the RF shutter may respond quickly and with little complexity to protect the electronic devices. To illustrate, when a high-power or high-frequency signal is received at the RF shutter, a large electric field may be generated in each microgap. The electric field may be sufficient to form an atmospheric pressure plasma or to initiate a phase transition in a phase change material, causing the mesh to behave as a continuous mesh. Thus, the mesh may act like a ground plane and reflect the high-power or high-frequency signal to protect the electronics behind it. Accordingly, a passive RF shutter can protect electronics from high-power and high-frequency signals when in an "on" state and allow transmission and reception of lower power, lower frequency signals when in an "off" state. A power level and a frequency of an incoming signal may determine whether the RF shutter is on or off.

FIG. 1A is a plan view of a particular embodiment of an apparatus 100 to protect an electronic device, and FIG. 1B is a closer view of a particular portion of the apparatus 100. The apparatus 100 includes a non-conductive substrate 102 and a plurality of conductive members 106. The conductive members 106 are arranged to form a discontinuous mesh 104. For example, the conductive members 106 may be arranged in cells, two of which are illustrated in FIG. 1B, with a gap 110 between adjacent cells. For example as shown in FIG. 1B, two cells including conductive members 106 and 107 are separated by the gap 110. Each of the cells has a characteristic dimension 114, such as width from center to center of adjacent gaps or a width from center to center of the conductive members 106 and 107. In a particular embodiment, the cells are approximately square and the characteristic dimension 114 is selected based on a first wavelength of a first signal to be allowed to pass through the apparatus 100 and a second wavelength of a second signal that is to be blocked by the apparatus 100. For example, the characteristic dimension 114 may be much smaller than the first wavelength, e.g., approximately one twenty-fifth of the first wavelength. In another example, the characteristic dimension 114 may be smaller than but closer to the second wavelength, e.g., approximately one half of the second wavelength. However, other proportions between the characteristic dimension 114 and the wavelength of the first signal and the second signal may also be used.

A width of the gaps 110 is related to electric field strength present in the gap 110 when the conductive elements 106 and 107 are subjected to electromagnetic radiation. For a particular frequency of electromagnetic radiation, a smaller gap width leads to a stronger electric field in the gap 110 and a larger gap width provides a weaker electric field in the gap 110.

The non-conductive substrate 102 may include a ceramic material, a polymer material, or another material that is not conductive or is dielectric. The non-conductive substrate 102 may be substantially transparent to electromagnetic energy in a particular range of concern. For example, the non-conductive substrate 102 may be transparent to a wavelength of signals intended to be transmitted and received through the apparatus 100 (e.g., relatively low-power, relatively low-frequency signals). The non-conductive substrate 102 may also be substantially transparent to signals to be blocked from transmissions through the apparatus 100 (e.g., relatively high-power or relatively high-frequency signals). The non-conductive substrate 102 may have a thickness sufficient to provide desired structural stability. In a particular embodiment, the non-conductive substrate 102 may be formed of a material that facilitates removal of heat that may be built up by the apparatus 100 during use. For example, the non-conductive substrate 102 may be formed of aluminum nitride, which is electrically insulating but may have suitable thermal conductivity.

The conductive members 106 and 107 may include any suitable conductor, such as silver, gold, copper, aluminum, or another metal or conductor selected for a particular application. In a particular embodiment, materials used to form the non-conductive substrate 102 and the conductive members 106 and 107 may be selected to facilitate low cost manufacturing of the apparatus 100. For example, the materials may be selected to facilitate manufacturing of the apparatus 100 using relatively inexpensive fabrication techniques that are commonly employed to manufacture integrated circuits and other electronic devices. To illustrate, the materials may be selected to enable manufacturing the apparatus 100 using wet etch, dry etch, deposition, photolithography, imprint lithography, chemical mechanical polishing, printing, or other additive or subtractive processes that are used to manufacture electronics and integrated circuits. For purposes of simulations described below the conductive members 106 and 107 were simulated to be formed of copper. The conductive members 106 and 107 may have a thickness of as little as a few skin depths. For example, for copper conductive members the skin depth may be approximately 3 microns, so a thickness of several skin depths, e.g., about 10 microns, may be sufficient.

In a particular embodiment, a phase change material 112 may be present at each of the gaps 110. For example, as described with reference to FIGS. 2A and 2B, the phase change material 112 may include a gas that undergoes a phase transition to a plasma. In another example, as described with reference to FIGS. 3A and 3B, the phase change material 112 may include a material that undergoes an insulator-metal phase transition, such as vanadium dioxide. The phase change material 112 may undergo a phase transition from a substantially non-conductive phase to a substantially conductive phase at least partially responsive to an incident electromagnetic waveform at the apparatus 100. Thus, the discontinuous mesh 104 may act as a continuous mesh responsive to the incident electromagnetic waveform. Accordingly, the apparatus 100 may selectively inhibit transmission of electromagnetic radiation based, for example, on characteristics of the electromagnetic radiation.

Figure 2B:
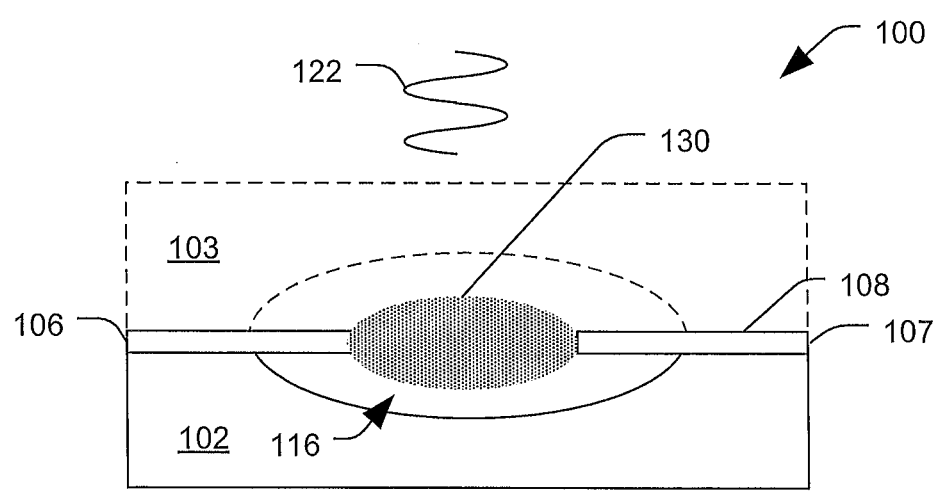
FIG. 2B is a sectional view of a gap between cells of the first embodiment of the apparatus of FIG. 1A in a second operational state.

FIG. 2A is a sectional side view of a gap 110 between cells of a first embodiment of the apparatus 100 of FIG. 1A in a first operational state. FIG. 2B is a sectional side view of the gap 110 between the cells of the first embodiment of the apparatus 100 of FIG. 1A in a second operational state. As illustrated in FIG. 2A, a first signal having a first waveform 120 may be received at the apparatus 100 and may be transmitted or permitted to propagate through the apparatus 100. Referring to FIG. 2B, a second signal having a second waveform 122 may be received at the apparatus 100 and may cause a gas (e.g., the phase change material 112 in the embodiment of FIG. 2A) in a cavity 116 defined proximate the gap 110 to form a plasma 130. The plasma 130 provides a conductive path across the gap 110. The plasma 130 may be electrically conductive enough to bridge the gap 110 to cause the discontinuous mesh formed by the conductive members 106 and 107 to behave as a continuous mesh. For example, electron density in the gap 110 may range from about $10^{13}$ electrons per cubic centimeter to as much as $10^{17}$ electrons per cubic centimeter, with a conductivity measuring from about $10^2$ Siemens per meter (S/m) to about $10^4$ S/m. Thus, the second signal having the second waveform 122 stimulates formation of the plasma 130 and thereby causes the discontinuous mesh to be continuous, blocking or inhibiting transmission or propagation of the second signal.

In the embodiment of FIGS. 2A and 2B, the cavity 116 may be formed in the non-conductive substrate 102 at the gap 110 between the adjacent conductive members 106 and 107. The cavity 116 may undercut a portion of the adjacent conductive members 106 and 107. The cavity 116 may have a depth of a same order of magnitude as the width of the gap 110. For example, when the width of the gap 110 is about 20 μm, the cavity 116 may have a depth of about 10 μm to about 40 μm. The cavity 116 may include the gas that forms the plasma 130 when the gas is excited by particular electromagnetic waveforms.

In a particular embodiment, the gas is retained by an overlaying substrate 103. In yet another embodiment, the overlaying substrate 103 may be large enough to encapsulate the whole mesh array rather than at individual gap 110 areas. The overlaying substrate 103 may be formed of the same material as the non-conductive substrate 102. For example, the conductive members 106 and 107 may be substantially encased or embedded within the non-conductive substrate 102 and the overlaying substrate 103. In another particular embodiment, the overlaying substrate 103 may not be present. For example, an upper surface 108 of the apparatus 100 may be exposed to air, and the air may form the plasma 130. In another example, the upper surface 108 of the apparatus 100 may be covered to retain the gas that forms the plasma 130. The gas may include air, a noble gas (e.g., argon), or another gas that has an acceptable operating range between an electric field strength that causes the gas to generate the plasma 130 and an electric field strength that causes dielectric breakdown of the gas, as described further below. For example, the dielectric breakdown field strength for air is about 60 times the plasma generation field strength, providing a dynamic operating range of about 18 decibels.

The apparatus 100 may selectively inhibit transmission of electromagnetic radiation based on characteristics of the electromagnetic radiation. For example, the gas may form the plasma 130 that electrically bridges the gap 110 to form an electrically continuous mesh in response to electromagnetic radiation having first characteristics (e.g., the second waveform 122). When the plasma 130 electrically bridges the gaps, the electromagnetic radiation having the first characteristics is inhibited from passing through the apparatus 100. However, the apparatus 100 allows electromagnetic radiation that has second characteristics (e.g., the first waveform 120) to pass through the apparatus 100.

Figure 3A:
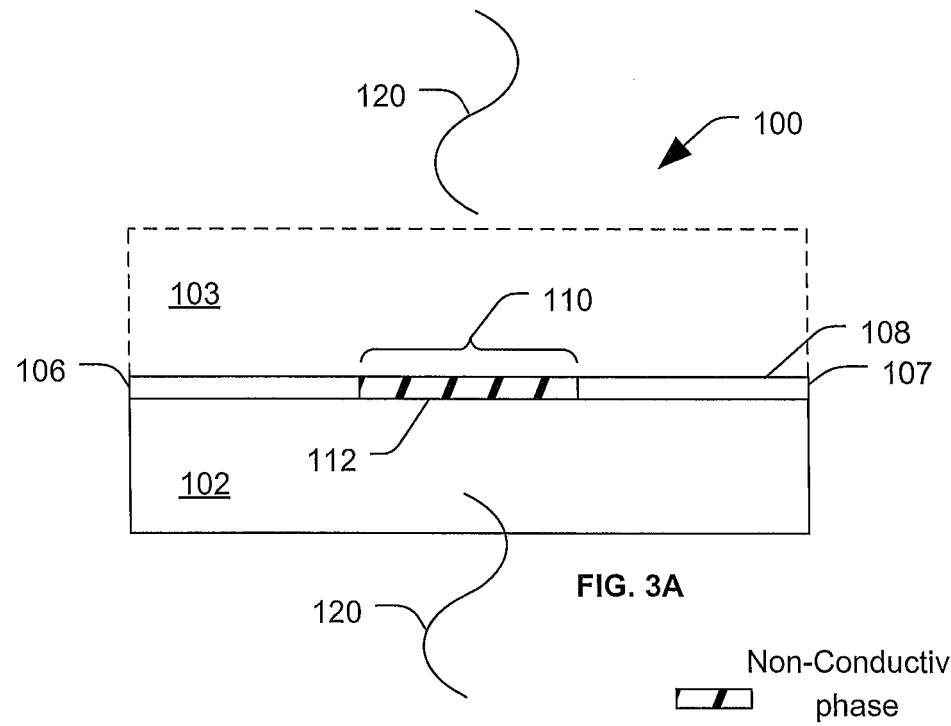
FIG. 3A is a sectional view of a gap between cells of a second embodiment of the apparatus of FIG. 1A in a first operational state.
Figure 3B:
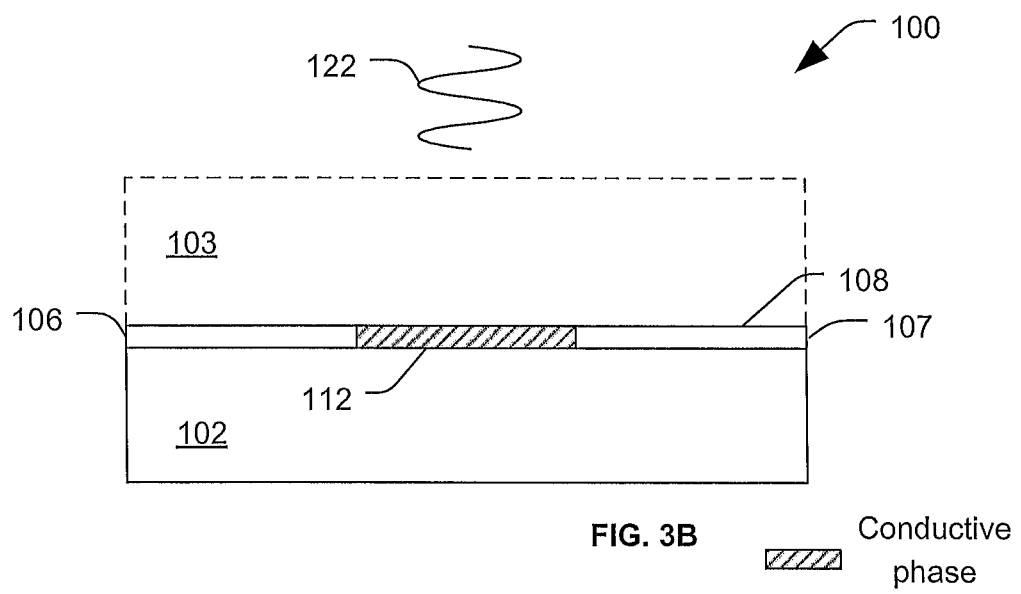
FIG. 3B is a sectional view of a gap between cells of the second embodiment of the apparatus of FIG. 1A in a second operational state.

FIG. 3A is a sectional side view of a gap 110 between cells of a second embodiment of the apparatus 100 of FIG. 1A in a first operational state. FIG. 3B is a sectional side view of the gap 110 between the cells of the second embodiment of the apparatus 100 of FIG. 1A in a second operational state. As illustrated in FIG. 3A, in the first operational state, the phase change material 112 is in a substantially non-conductive phase, and a first signal having a first waveform 120 may be received at the apparatus 100 and may be transmitted or permitted to propagate through the apparatus 100. Referring to FIG. 3B, a second signal having a second waveform 122 may be received at the apparatus 100 and may cause the apparatus 100 to transition to the second operation state. For example, the second waveform 122 may cause the phase change material 112 to undergo a phase transition to a substantially conductive state. In the substantially conductive state, the phase change material 112 provides a conductive path across the gap 110. Thus, in the substantially conductive state, the phase change material 112 causes the discontinuous mesh to become continuous, blocking or inhibiting transmission or propagation of the second signal.

In the embodiment of FIGS. 3A and 3B, the phase change material 112 may include any material that undergoes a solid-solid metal-insulator phase transition. Such solid-solid metal-insulator phase transitions are also referred to in the art as semiconductor-metal phase transitions. Examples of such materials that undergo a solid-solid metal-insulator phase transition include, but are not limited to, $GeSb_2Te_4$, $RNiO_3$ (where R=Pr, Nd, or Sm), $LaCoO_3$, particular transition metal oxides, such as certain titanium oxides, e.g., titanium sequioxide ($Ti_2O_3$), certain vanadium oxides, e.g., vanadium dioxide ($VO_2$), and vanadium sequioxide ($V_2O_3$). The phase change material 112 may also be doped with another material to modify characteristics of the phase transition, such as a phase transition critical temperature or another critical property at which the phase transition occurs (e.g., electric field strength, current, voltage, etc.). Dopants may include, for example, W, Cr, Ta, Al or another material.

The apparatus 100 may selectively inhibit transmission of electromagnetic radiation based on characteristics of the electromagnetic radiation. For example, the phase change material 112 may undergo the phase transition responsive, at least partially, to the characteristics of the electromagnetic radiation. That is, the characteristics of the electromagnetic radiation alone or in concert with other factors (e.g., a temperature of the apparatus 100, a bias current applied to the apparatus 100, another signal applied to the apparatus 100, or another factor that preconditions or biases the phase change material 112 to be near a phase transition critical point) may cause the phase change material 112 to undergo the phase transition. To illustrate, the first waveform 120 may have first characteristics (e.g., frequency, power, electric field generated in the gap 110) that do not cause the phase change material 112 to undergo the phase transition, and the second waveform 122 may have second characteristics (e.g., frequency, power, electric field generated in the gap 110) that cause the phase change material 112 to undergo the phase transition.

Figure 4A:
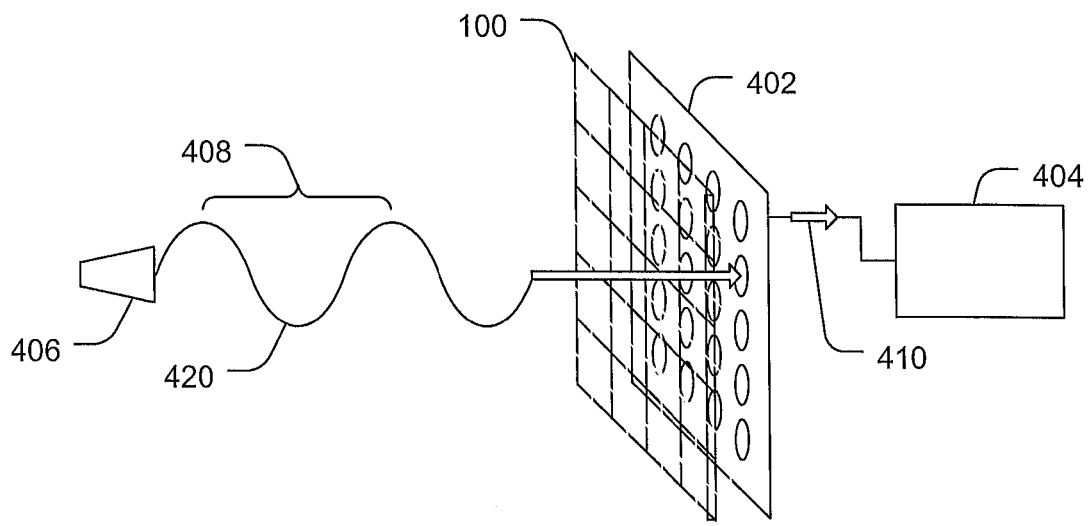
FIG. 4A is a perspective view of a first particular embodiment of a system to protect an electronic device in a first operational state.

FIG. 4A is a perspective view of a first particular embodiment of a system to protect an electronic device in a first operational state. The system includes an electronic device 404 coupled to an antenna 402 and protected by the apparatus 100. The electronic device 404 may include one or more low-noise amplifiers or other devices to be protected from high-power or high-frequency signals.

A first signal having a first waveform 420 may be transmitted by a transmitter 406 and received at the antenna 402. The first waveform 420 may have characteristics (such as a wavelength 408) that do not cause a phase change material present in gaps of the apparatus 100 to undergo a phase transition. Thus, the first signal is able to pass through the apparatus 100, to be received at the antenna 402, and to be sent as a signal 410 to the electronic device 404.

Figure 4B:
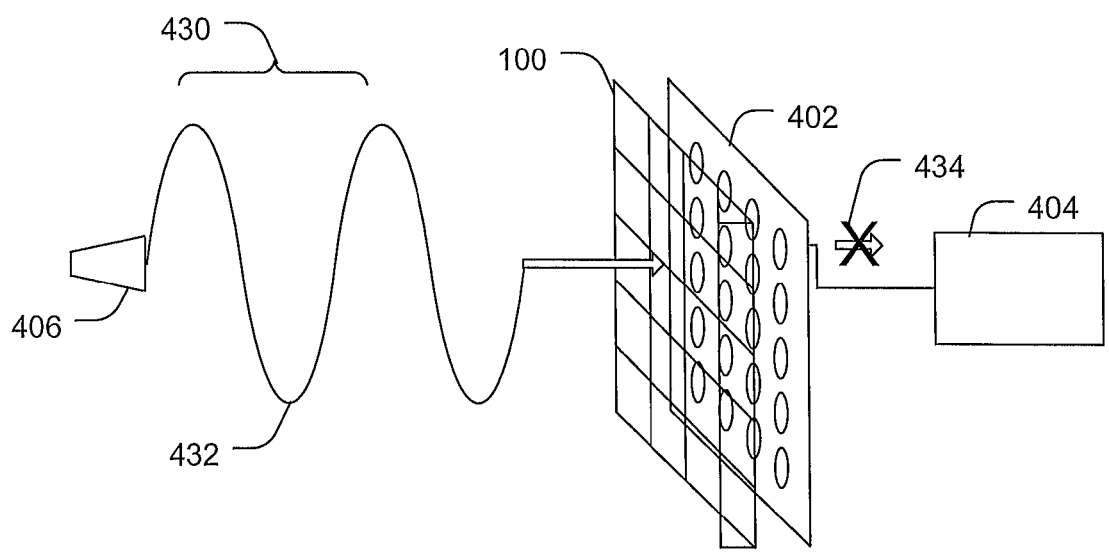
FIG. 4B is a perspective view of the system of FIG. 4A in a second operational state.

FIG. 4B is a perspective view of the system of FIG. 4A in a second operational state. In FIG. 4B, the transmitter 406 transmits a second signal having a second waveform 432. The second waveform 432 may be characterized by particular parameters, such as a second wavelength 430, an amplitude, a signal strength, and so forth. When the second signal is received at the apparatus 100, the second signal may stimulate the phase change material of the apparatus 100 to undergo the phase transition. Accordingly, the apparatus 100 in FIG. 4B is illustrated as continuous (i.e., without gaps) due to the presence of the substantially conductive phase of the phase change material in the gaps of the apparatus 100. The apparatus 100 may act as a ground plane to reflect or block transmission of the second signal, resulting in the second signal not being received at the antenna 402. As illustrated in FIG. 4B, no second signal 434 is received at the electronic device 404, and the electronic device 404 is protected from harm as a result of the second signal.

Thus, the apparatus 100 acts as a passive RF shutter to that allows some signals to pass through and blocks or reflects other signals. Put another way, the apparatus 100 has a first operational state in which the apparatus 100 is substantially transparent to a first electromagnetic waveform and a second operational state that is engaged when the apparatus 100 is exposed to a second electromagnetic waveform that is different than the first electromagnetic waveform. In the second operational state, the apparatus 100 may be substantially opaque to the first electromagnetic waveform and to the second electromagnetic waveform. The apparatus 100 is able to block certain signals quickly, with little added complexity, and without the use of external control systems and power systems. Rather, the signal to be blocked itself stimulates the phase transition that causes the signal to be blocked. Accordingly, the switching time required to switch the apparatus 100 from the first operational state (where signals are allowed to pass through) to the second operational state (where signals are not allowed to pass through) may be less than about 2 nanoseconds. In some embodiments, the switching time may be less than a nanosecond. For example, the switching time when a solid-solid phase change material is used may be less than one picoseconds, e.g., about 100 femtoseconds.

FIG. 5 is a perspective view of a second particular embodiment of a system to protect the electronic device 404. The system of FIG. 5 is an active protection system for the electronic device 404. The system includes a third transmitter 526 that sends a third signal having a third waveform 522. The third waveform 522 may include particular characteristics, such as a third wavelength 524, an amplitude, and signal strength when received at the apparatus 100. As previously described, the apparatus 100 is discontinuous and substantially transparent to signals having certain waveforms, which enables those signals to be received at the antenna 402. In a particular embodiment, the third waveform 522 is selected to stimulate the phase transition in the phase change material present in the gaps of the apparatus 100. For example, the third transmitter 526 may be a relatively low power, high frequency transmitter located relatively near the antenna 402.

In a particular embodiment, the third transmitter 526 is under control of a controller 540 associated with the electronic device 404. The third transmitter 526 may be used to turn on protective characteristics of the apparatus 100 in response to the controller 540. For example, the transmitter 406 may be a perceived threat to the electronic device 404. That is, the transmitter 406 may be capable of transmitting a fourth signal 520 that may be harmful to the electronic device 404. The controller 540 may engage the third transmitter 526 to stimulate the phase transition of the phase change material of the apparatus 100 when the perceived threat is near the electronic device 404.

In another example, the transmitter 406 may be a relatively high-power transmitter that is collocated with the electronic device 404. The transmitter 406 may periodically or occasionally transmit signals that could be harmful to the electronic device 404. The controller 540 may selectively engage the third transmitter 526 to stimulate the phase transition of the phase change material of the apparatus 100 when the transmitter 406 is transmitting or is about to transmit the potentially harmful fourth signal 520.

In yet another example, the third transmitter 526 may send the third signal to stimulate the phase transition of the phase change material all of the time except for when the electronic device 404 is to send or receive signals via the antenna 402. To illustrate, the third transmitter 526 may leave the apparatus 100 "on" (e.g., in the second operational state described above) to block signals from being received at the electronic device 404 until a particular time when the signals are expected or desired, at which point the third transmitter 526 may cease sending the third signal to turn the apparatus 100 "off" (e.g., in the first operational state described above).

In a particular embodiment, the system includes the first apparatus 100 and a second apparatus 550. The second apparatus 550 may be included as a layer over or under the first apparatus 100. The second apparatus 550 may include a second discontinuous mesh formed by second conductive members spaced apart by second gaps. The second apparatus 550 may be configured to transition from the first operational state, in which the mesh of the second apparatus 550 is discontinuous, to the second operation state, in which the mesh of the second apparatus 550 behaves as continuous, in a different manner than or responsive to different conditions than the first apparatus 100. For example, the second gaps may have different widths than the gaps of the apparatus 100. The width of the gap may be related to the electric field strength in the gap when a mesh is exposed to electromagnetic radiation. Thus, smaller gaps may exhibit a stronger electric field than larger gaps. Accordingly, the larger gaps of the second apparatus 550 may experience smaller electric fields than the smaller gaps of the first apparatus 100 when both are subjected to the fourth signal 520. Thus, a phase change that is responsive to electric field strength may occur under different circumstance in the second apparatus 550 than at the first apparatus 100. To illustrate, a higher power signal or higher frequency signal may cause the phase transition of the second apparatus 550 than a signal that causes the phase transition of the first apparatus 100. A very high power signal may cause failure of the first apparatus 100, e.g., by exceeding a dielectric breakdown threshold of the phase change material. In this circumstance, the second apparatus 550 provides a higher power tolerance backup to the first apparatus 100, while the first apparatus 100 provides lower power switching to the second operational state (e.g., "on" state) to provide a fast switching response to the fourth signal 520.

To illustrate, when the phase change material is a gas that undergoes a phase transition to a plasma and when the fourth signal 620 is a relatively high-power signal, the smaller gaps of the apparatus 100 may have a strong enough electric field to exceed a dielectric breakdown threshold of the gas in the gaps of the apparatus 100. Thus, the gaps of the apparatus 100 may experience damaging arching or coronal discharge. The second gaps of the second apparatus 550 are larger and have a smaller electric field. When the apparatus 100 and the second apparatus 550 use the same gas in their respective gaps, the second gaps can endure a stronger signal than the gaps of the apparatus 100 without exceeding the dielectric breakdown threshold of the gas. In a particular embodiment, the apparatus 100 and the second apparatus 550 may use different gases with different dielectric breakdown threshold to provide protection against signals with different signal strengths.

In another example, the first apparatus 100 may include a first metal-insulator phase change material and the second apparatus 550 may include a second metal-insulator phase change material. The first metal-insulator phase change material may undergo a phase transition under different circumstances than the second metal-insulator phase change material. Thus, the first metal-insulator phase change material and the second metal-insulator phase change material may be responsive to different signal characteristics and thus provide protection against different signals. Alternately, or in addition, the first metal-insulator phase change material may fail (e.g., due to resistive heating) under different circumstances than the second metal-insulator phase change material. Thus, the second apparatus 550 may be a backup to the first apparatus 100.

In yet another example, the phase change materials used in each of the apparatuses 100, 550 are of different types. To illustrate, the first apparatus 100 may include a metal-insulator phase change material, and the second apparatus 550 may include a gas that undergoes a phase transition to a plasma. Alternately, the second apparatus 550 may include the metal-insulator phase change material, and the first apparatus 100 may include the gas that undergoes the phase transition to the plasma. The particular types of the phase change materials of each apparatus 100, 550 and the arrangement of the apparatuses 100, 550 may be selected based on protective characteristics that are desired for the system. For example, since the solid-solid metal-insulator phase transition is generally faster than a gas-plasma phase transition, the first apparatus 100 may use a solid-solid metal-insulator phase change material to provide a rapid response solid-solid metal-insulator phase change material that may break down at a lower power level than a plasma generated in relatively large gaps of the second apparatus 550. Accordingly, a gas-plasma material may be used with the relatively large gaps in the second apparatus 550.

Gaps widths, characteristic dimensions, phase change materials (e.g., gases, dopants, etc.), or any combination thereof of the apparatus 100 and the second apparatus 550 may be selected to cause the apparatus 100 and the second apparatus 550 to provide different protection characteristics. For example, the second apparatus 550 may have a different characteristic dimension than the characteristic dimension 114 (shown in FIG. 1) of the first apparatus 100. Thus, the first apparatus 100 and the second apparatus 550 may turn on (e.g., transition to the second operational state) in response to different waveforms and may be able to endure different waveforms without being overpowered (e.g., before a dielectric breakdown threshold is reached). In another example, when both of the apparatuses 100, 550 use metal-insulator phase change materials in the gaps, the gaps of the apparatuses 100, 550 may be the same size and the metal-insulator phase change materials may be different to provide different response characteristics of the apparatuses 100, 550. To illustrate, the first metal-insulator phase change material may be doped, and the second metal-insulator phase change material may be undoped or differently doped to provide response characteristics that are distinct from response characteristics of the first metal-insulator phase change material.

Further, although only two apparatuses are illustrated in FIG. 5, the system may include more than two apparatuses or layers. When more than two apparatuses are included, the additional apparatus or apparatuses may have characteristic dimensions, phase change materials (e.g., gases, dopants, etc.) and/or gaps selected to provide desired protection characteristics. Additionally, although the second apparatus 550 is only shown in the active system illustrated in FIG. 5, the second apparatus 550 or other layers may be used with a passive system, such as the system described with reference to FIGS. 4A and 4B.

Figure 6:
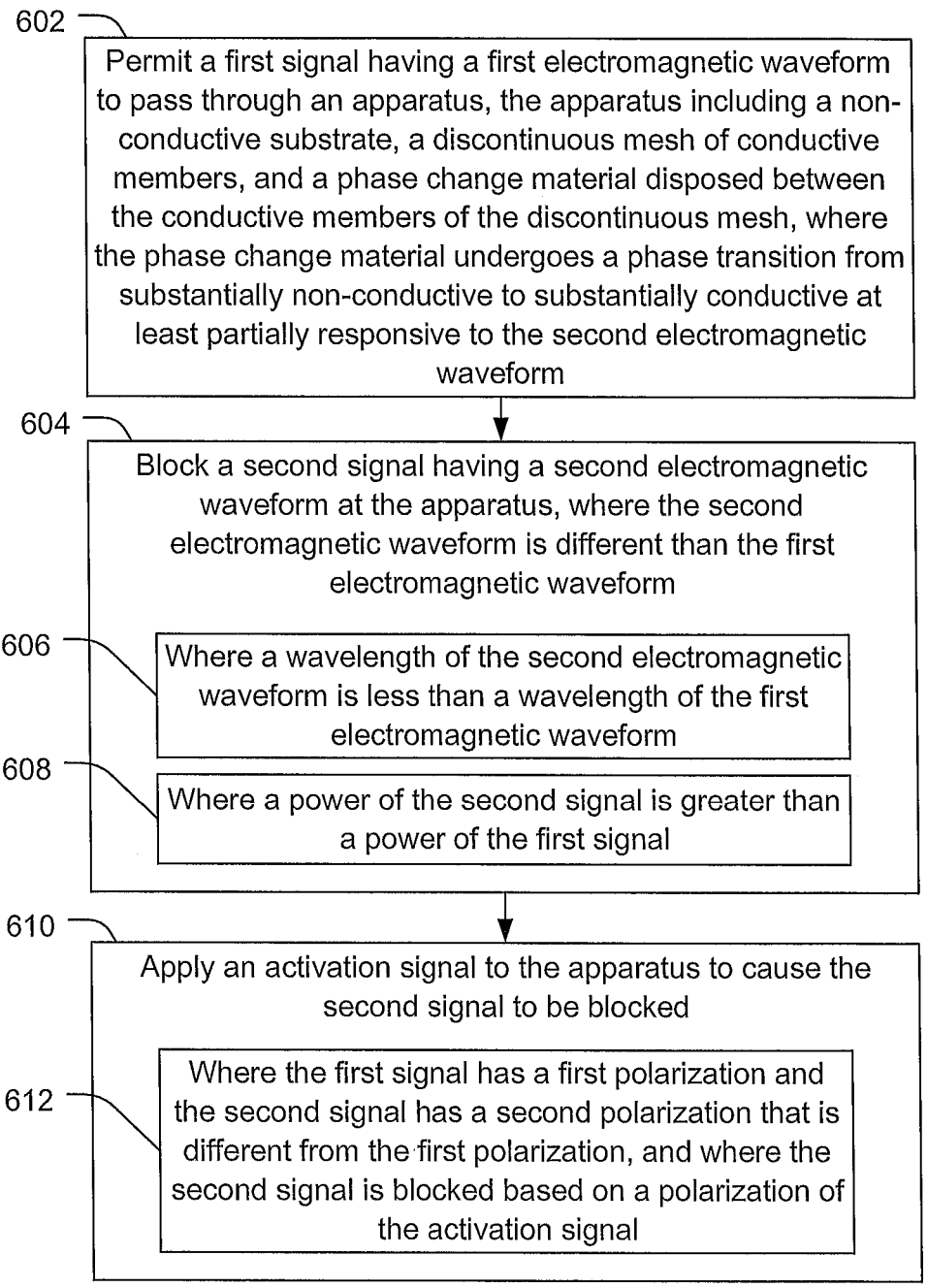
FIG. 6 is a flow chart of a first particular embodiment of a method to protect an electronic device.

FIG. 6 illustrates a first particular embodiment of a method of protecting an electronic device. The method includes, at 602, permitting a first signal having a first electromagnetic waveform to pass through an apparatus. For example, the apparatus may be a protection device, such as the apparatus 100 of FIG. 1, that includes a non-conductive substrate and a discontinuous mesh of conductive members. A phase change material may be disposed between the conductive members of the discontinuous mesh. The phase change material may undergo a phase transition from substantially non-conductive to substantially conductive at least partially responsive to the second electromagnetic waveform. For example, the phase transition may include a solid-solid metal-insulator phase transition, a gas-plasma phase transition, or another phase transition that results in a non-conductive to substantially conductive material becoming conductive.

The method also includes, at 604, blocking a second signal having a second electromagnetic waveform at the apparatus. The second electromagnetic waveform may be different than the first electromagnetic waveform. The second electromagnetic waveform may cause the phase change material to undergo the phase transition and to become substantially conductive. For example, a wavelength of the second electromagnetic waveform may be smaller than a wavelength of the first electromagnetic waveform, at 606. The phase change material may undergo the phase transition responsive, at least in part, to effects of the wavelength of the second electromagnetic waveform on the apparatus or on the phase change material. In another example, a power of the second signal may be greater than the first signal, at 608. The phase change material may undergo the phase transition responsive, at least in part, to effects of the power of the second electromagnetic waveform.

The method may also include, at 610, applying an activation signal to the apparatus to cause the second signal to be blocked. For example, a transmitter, such as the third transmitter 526 of FIG. 5, may be used to selectively turn the apparatus "on," so that signals are blocked, or "off," so that signals can pass through. In a particular embodiment, the activation signal may have a first polarization and an incoming signal may have a second polarization that is different from the first polarization. The incoming signal may be blocked based on first polarization of the activation signal, at 612.

Figure 7:
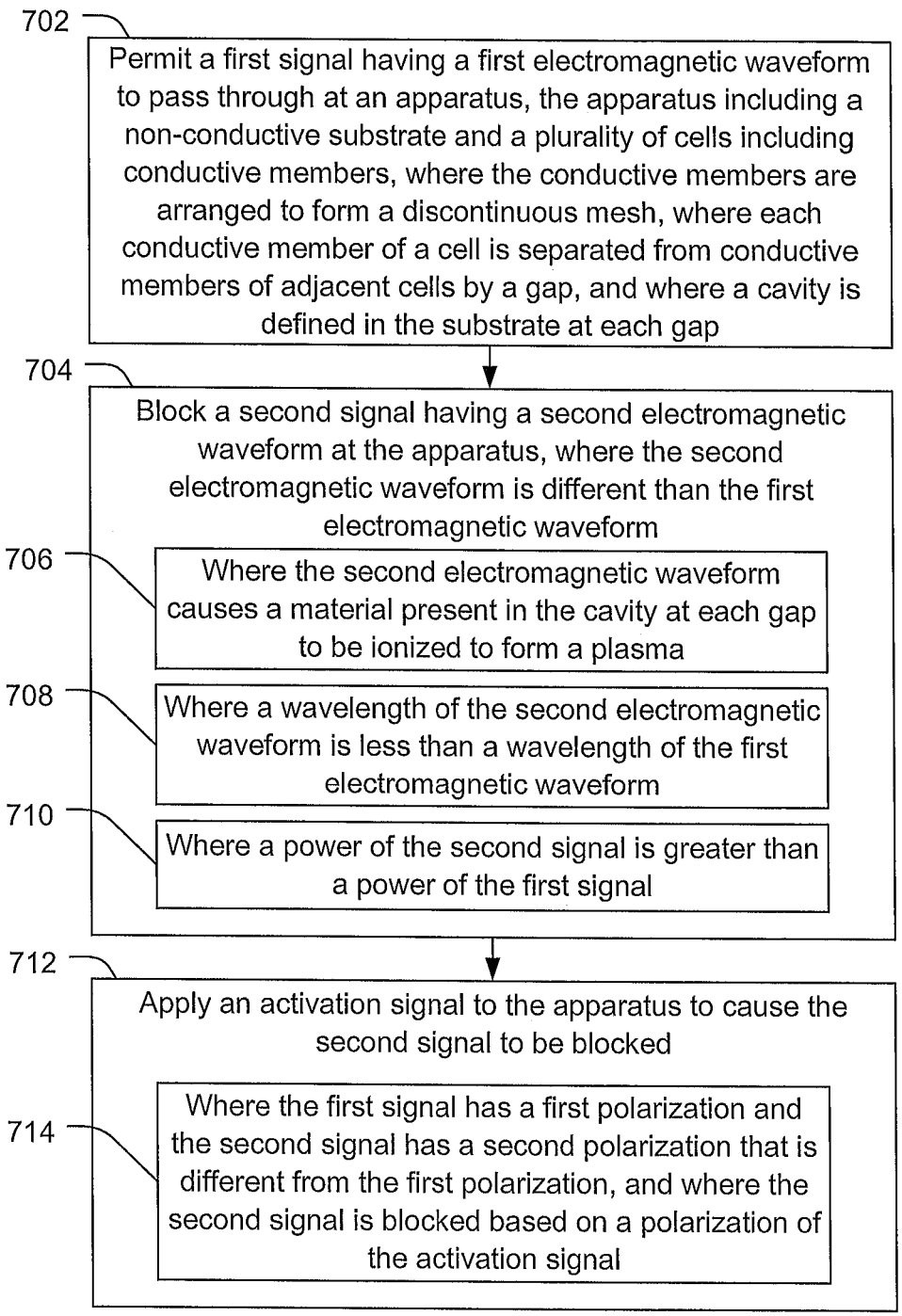
FIG. 7 is a flow chart of a second particular embodiment of a method to protect an electronic device.

FIG. 7 illustrates a second particular embodiment of a method of protecting an electronic device. The method includes, at 702, permitting a first signal having a first electromagnetic waveform to pass through an apparatus. For example, the apparatus may be a protection device, such as the apparatus 100, that includes a discontinuous mesh of conductive members separated by gaps. The apparatus may include a non-conductive substrate and a plurality of cells including conductive members. Conductive members may be arranged to form the discontinuous mesh. Each conductive member of a cell is separated from conductive members of adjacent cells by a gap. A cavity may be defined in the non-conductive substrate at each gap. In response to exposure to particular electromagnetic waveforms, a plasma may be formed in the cavity at each gap.

The method also includes, at 704, blocking a second signal having a second electromagnetic waveform at the apparatus. The second electromagnetic waveform may be different than the first electromagnetic waveform. For example, the second electromagnetic waveform may cause a material present in the cavity at each gap to be ionized to form a plasma, at 706. To illustrate, a wavelength of the second electromagnetic waveform may be smaller than a wavelength of the first electromagnetic waveform, at 708. The wavelength of the second electromagnetic waveform may stimulate or excite the material present in the cavity to form the plasma. In another illustrative example, the power of the second signal may be greater than the first signal, at 710. The plasma may be stimulated in the cavity at each gap in response to the second signal due to the signal strength.

The method may also include, at 712, applying an activation signal to the apparatus to cause the second signal to be blocked. For example, a transmitter, such as the third transmitter 526 of FIG. 5, may be used to selectively turn the apparatus "on," so that signals are blocked, or "off," so that signals can pass through. In a particular embodiment, the activation signal may have a first polarization and an incoming signal may have a second polarization that is different from the first polarization. The incoming signal may be blocked based on first polarization of the activation signal, at 714.

Figure 9:
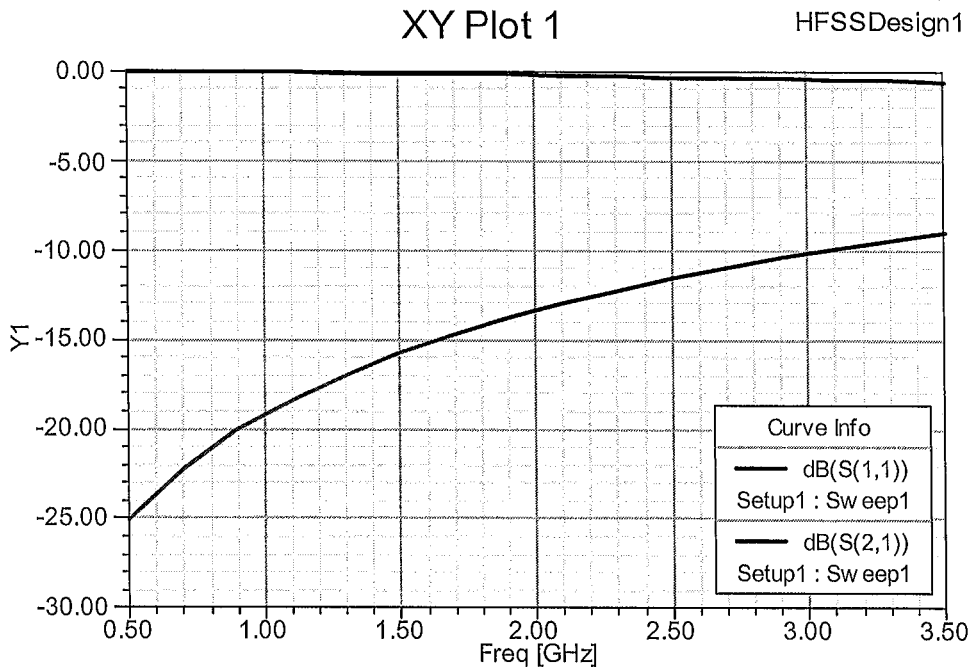
FIG. 9 is a graph of simulated scattering parameters of a particular embodiment of a protection device in a second operational state.
Figure 10:
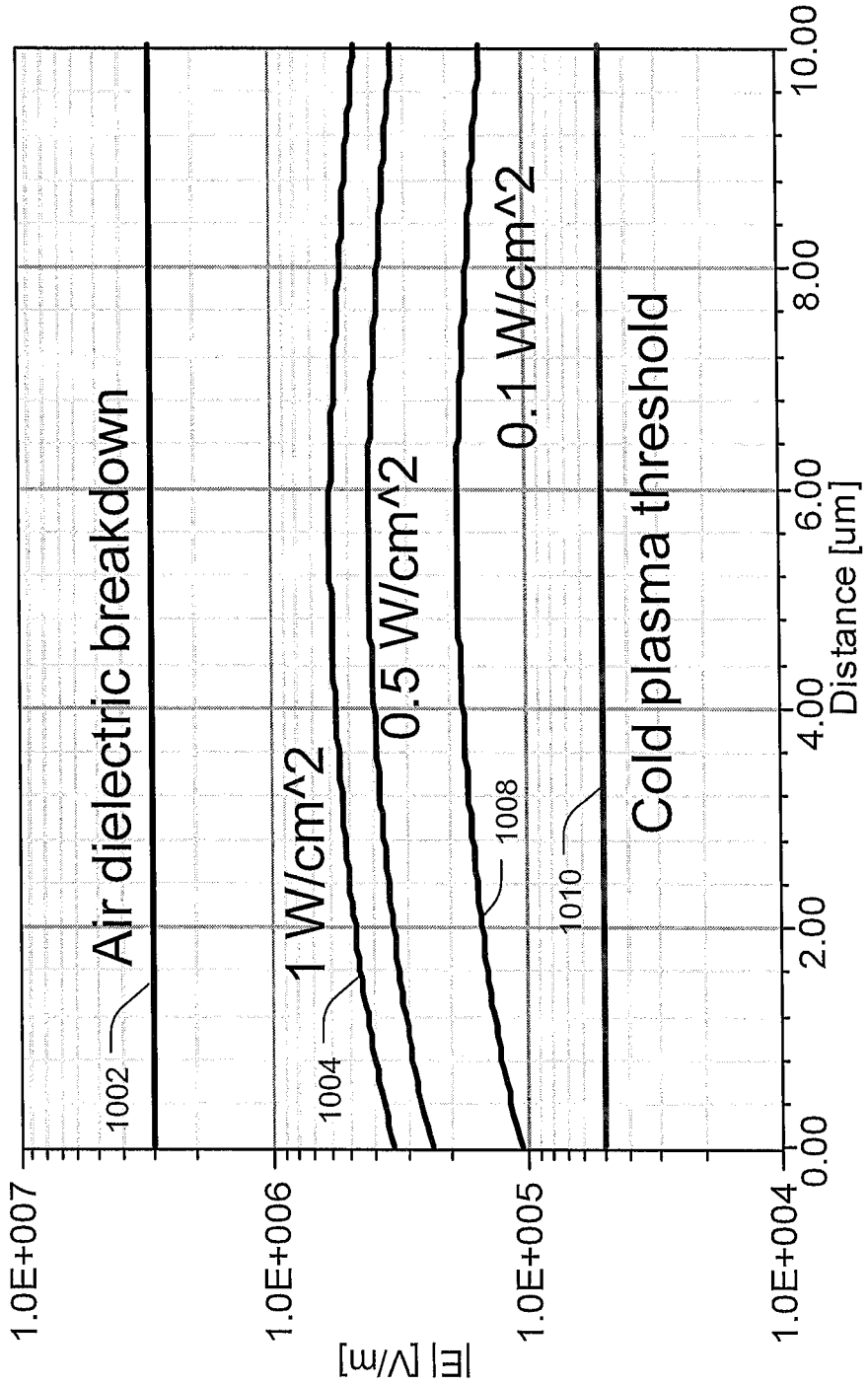
FIG. 10 is a graph of simulated electric field characteristics across half of a gap of a discontinuous mesh according to a first particular embodiment.
Figure 11:
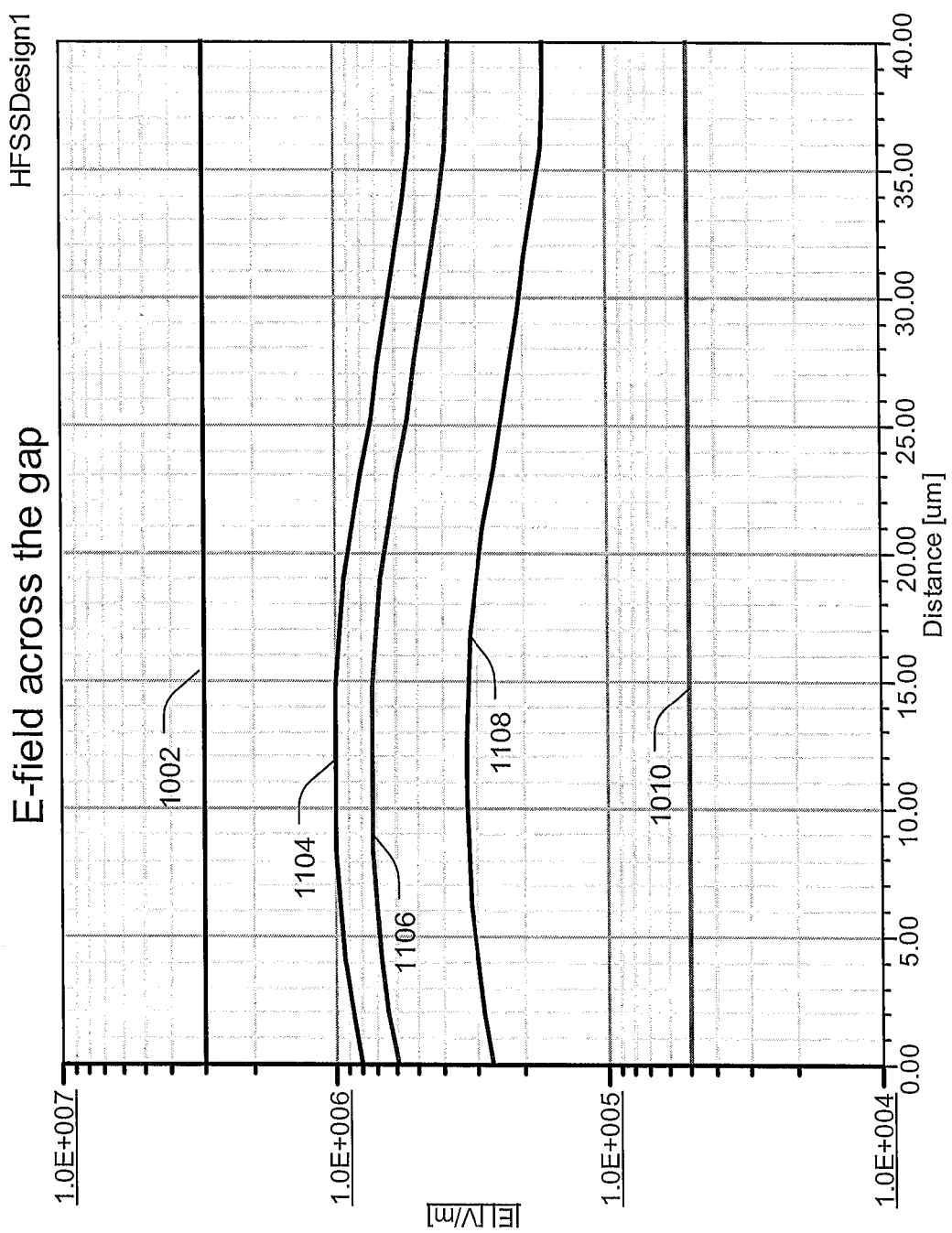
FIG. 11 is a graph of simulated electric field characteristics across half of a gap of a discontinuous mesh according to a second particular embodiment.

FIGS. 8-13 illustrate results of simulations that were conducted to characterize performance of a protection device, such as the apparatus 100 described above. For purposes of the simulations, the conductive members 106 and 107 of the apparatus 100 were simulated as 70 µm wide copper traces with gaps midway between intersections of vertical and horizontal traces. For a first simulation, results of which are illustrated in FIGS. 8, 9, 10 and 12, the gaps 110 were simulated as having a width of approximately 20 µm, and the cell size or characteristic dimension 114 of the cells was simulated as about 5 mm. For a second simulation, results of which are illustrated in FIG. 11, the gaps 110 were simulated as having a width of approximately 80 µm, and the cell size or characteristic dimension 114 of the cells was simulated as about 5 mm.

Figure 8:
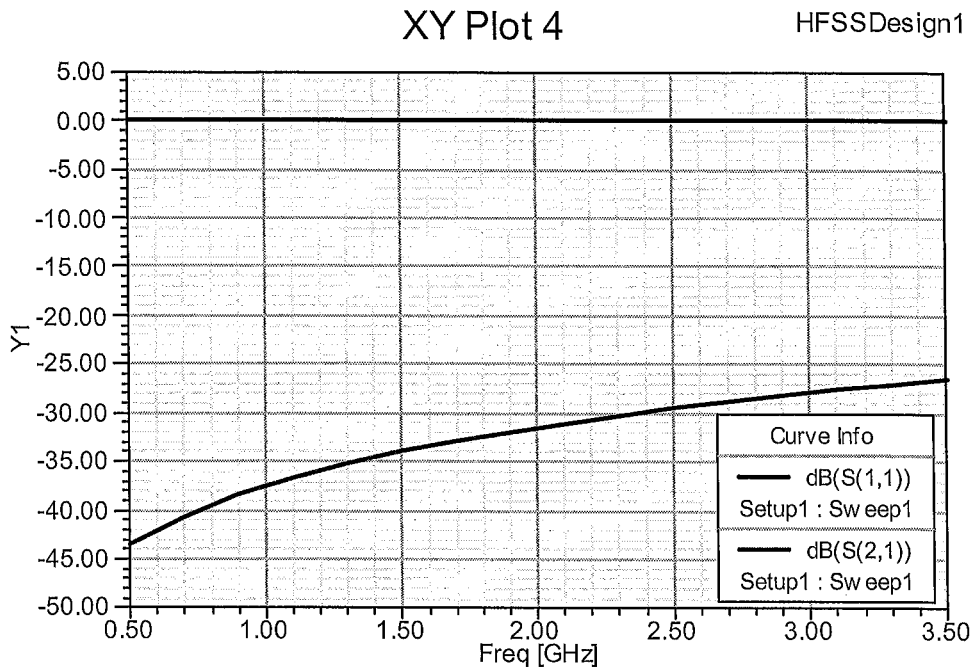
FIG. 8 is a graph of simulated scattering parameters of a particular embodiment of a protection device in a first operational state.

FIG. 8 is a graph of scattering parameters of a simulated protection device in a first operational state in which the gaps are discontinuities in the conductive members. As shown in FIG. 8, when subjected to a 2.45 gigahertz signal, substantially all of the signal is transmitted through the apparatus, with less than a 30 decibel reflection at 2.45 gigahertz.

FIG. 9 is a graph of simulated scattering parameters of a particular embodiment of a protection device in a second operational state in which no discontinuities are present in the conductive members. FIG. 9 shows that with the gaps bridged, the apparatus 100 acts as an effective ground plane and reflects most of the incoming signal with less than 12 decimals getting through at 2.45 gigahertz. It is noted that performance of the apparatus 100 may be improved by adjusting a size of the mesh (e.g., a distance between intersection points or approximate size of the cells) to be more sub-wavelength. The performance of the apparatus 100 may also be improved by using several layers of mesh with different characteristics.

FIG. 10 is a graph of simulated electric field characteristics across half of a gap of a discontinuous mesh according to a first particular embodiment. Magnitude of the electric field is shown along the y-axis. A location along the gap is shown along the x-axis, starting at distance 0, which is the edge of a conductive member, and extending to a distance 10 µm from the edge of the conductive member, which is approximately a center of the gap. The electric field across the gap is believed to be approximately symmetric about the center of the gap; thus, only half of the gap was simulated. The graph in FIG. 10 shows the electric field strength at points in the gap when the conductive members are exposed to a 2.45 GHz signal at various incident power levels. For example, at an incident power of about 1 watt/cm^2, the electric field strength inside the gap ranges from about $3.5 \times 10^5$ volts per meter to about $6 \times 10^5$ volts per meter, as shown by line 1004. At an incident power of 0.1 watt/cm^2, the electric field strength ranges from about $1 \times 10^5$ volts per meter to about $1.9 \times 10^5$ volts per meter, as shown by line 1008. Both of these incident power levels produce sufficient electric field strength to initiate plasma in the gap. That is, both incident power levels exceed a plasma threshold of air 1010. Yet both of these incident power levels remain safely below the dielectric breakdown threshold of air 1002.

Studies by others have shown that vanadium (IV) oxide ($VO_2$) can be stimulated to transition from an insulator phase to a metal phase by 7.1 volts over a 3 micron gap, or a field strength of $2.4 \times 10^6$ volts per meter, which is less than the field strength for a gap of a few microns at incident power of 1 W/cm^2. Accordingly, it is believed that threshold power for vanadium oxide can be lowered significantly below 1 W/cm^2 with a smaller gap, even sub-micron sizes.

Different gap sizes may accommodate different incident power levels without exceeding the dielectric breakdown threshold of air 1002. Additionally, different gases may have different plasma thresholds and dielectric breakdown thresholds. Accordingly, a gap size and a gas may be selected to provide protection for particular incident power levels of particular frequencies of electromagnetic radiation.

FIG. 11 is a graph of simulated electric field characteristics across half of a gap of a discontinuous mesh according to a second particular embodiment. As in FIG. 10, only a half-gap is illustrated. The gap simulated for FIG. 11 has a width of gap at 80 μm. Since the electric field strength is believed to be symmetrical in the gap, the x-axis shows the distance from the edge of a conductive member at 0 to the midpoint of the gap at 40 μm. The graph in FIG. 11 also shows the dielectric breakdown threshold of air 1002 and the plasma threshold of air 1010. The graph shows electric field strength for a 2.45 GHz signal at various incident power levels.

The electric field strength in the gap for a 1 watt/cm^2 incident power is shown by line 1108. Thus, for the 80 μm gap, 1 watt/cm^2 incident power is sufficient to surpass the plasma threshold of air 1010 but remains below the dielectric breakdown threshold of air 1002. The electric field strength in the gap for a 5 watt/cm^2 incident power is shown by line 1106, and the electric field strength in the gap for a 10 watt/cm^2 incident power is shown by line 1104. Both the 5 watt/cm^2 incident power and the 10 watt/cm^2 incident power are sufficient to surpass the plasma threshold of air 1010 but remain below the dielectric breakdown threshold of air 1002. Thus, by widening the gap from the 20 μm gap simulated in FIG. 10 to the 80 μm gap simulated in FIG. 11, a higher incident power level signal can be blocked. For example, the 80 μm gap can withstand at least a 10 watt/cm^2 incident power level without reaching the dielectric breakdown threshold of air 1002.

Figure 12:
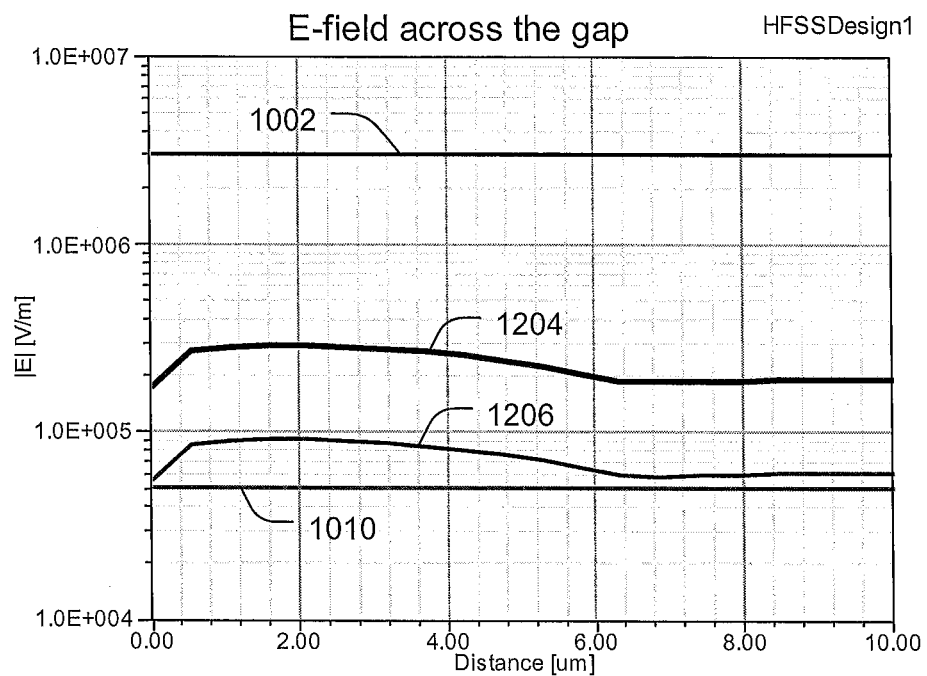
FIG. 12 is a graph of simulated electric field characteristics across half of a gap of a discontinuous mesh according to a third particular embodiment.

FIG. 12 is a graph of simulated electric field characteristics across half of a gap of a discontinuous mesh according to a third particular embodiment. For FIG. 12, the gap was simulated as having a width of 20 μm, with half of the gap shown in FIG. 12. FIG. 12 shows how a higher frequency signal with a lower incident power level affects the electric field in the gap. Specifically, FIG. 12 shows the electric field in the gap for various incident power levels of a 30.6 GHz signal, as compared to the 2.45 GHz signal used for FIG. 10 with the same gap width. The plasma threshold of air 1010 and the dielectric breakdown threshold of air 1002 are also shown in FIG. 12.

The higher frequency signal used for FIG. 12 may provide better coupling across the gap using less power. To illustrate, line 1206 shows the electric field across the gap at a 1 mW/cm^2 incident power level. Thus, using a 30.6 GHz signal, an incident power level as low as 1 mW/cm^2 is sufficient to generate a plasma in the gap. The line 1204 shows the electric field across the gap at a 10 mW/cm^2 incident power level.

While the simulations described above illustrate effects of frequency of a received signal and gap width and power on generation of a plasma, another consideration is response time. That is, how long it takes for the mesh to switch from an inactive state to an active state. The switching response time may be approximated by a time required for the phase change. For example, when the phase change material used is a gas that transitions to a plasma, the switching response time is approximately the plasma initiation time, e.g., how much time is required to initiate the plasma. The plasma is initiated when electrons of the gas in the gap become ionized. Thus, a time required for an electron to achieve ionization energy in response to an electric field is an estimate of the plasma initiation time.

Figure 13:
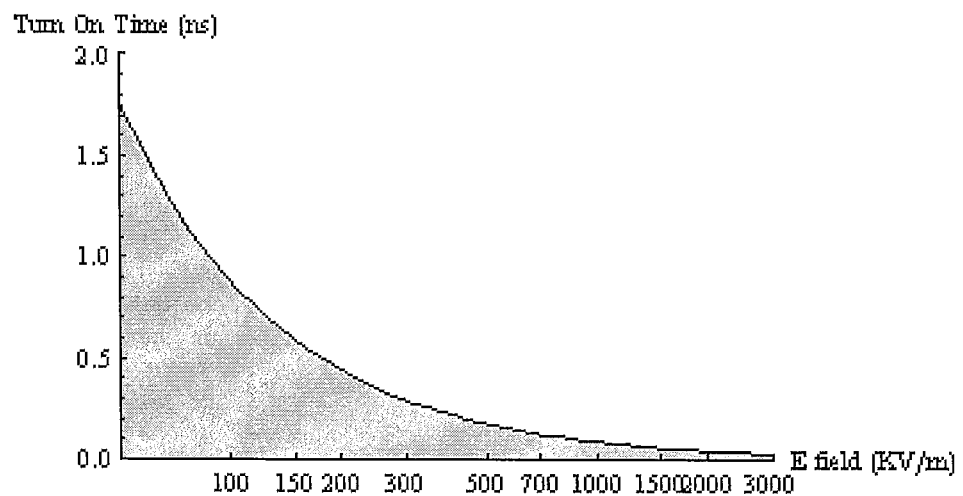
FIG. 13 is a graph of estimated turn on time of a protection device according to a particular embodiment.

FIG. 13 is a graph of estimated turn on time of a protection device according to a particular embodiment. FIG. 13 graphs an approximation of the time required for an electron in an electric field to gain enough energy for ionization neglecting electron energy lost during inelastic collisions with gas molecular species. This graph demonstrates that for various electric field strengths, the time required for an electron to become ionized is less than about two nanoseconds. Accordingly, the turn on response time for this particular embodiment is expected to be about two nanoseconds or less. The solid-solid metal insulator phase transition in vanadium dioxide has been estimated in some tests to take approximately 100 femtoseconds. Accordingly, embodiments that use a solid-solid metal insulator phase change material may have a response time that is less than one picoseconds, e.g., about 100 femtoseconds.

Various embodiments disclosed provide protection devices to protect electronics. A protection device includes a discontinuous mesh that can act as a protective screen for communication systems and other electronic systems that may be susceptible to electromagnetic damage due to high-power electromagnetic radiation. The discontinuous mesh may act as a nonlinear element that is substantially transparent to electromagnetic radiation at low powers or particular frequencies and that becomes substantially opaque or reflective to high-power electromagnetic radiation. The protection device may be passive in that it reacts to switch from the transparent state to the opaque state in response to the incident electromagnetic radiation that is to be blocked. The protection device may also be actively controlled by transmitting a signal having a desired modulation toward the discontinuous mesh when it is desired to switch the discontinuous mesh to a protection state. The protection device may include multiple layers of the discontinuous mesh to provide protection at different incident power levels.

The discontinuous mesh may act as an electromagnetic shutter to provide passive protection without requiring sensing systems or other complex circuitry for switching. Characteristics of an incident signal (e.g., the incident power level and frequency) may determine whether the incident signal is allowed to pass through the discontinuous mesh or is blocked by the discontinuous mesh.

Using active modulation, it is possible to illuminate the discontinuous mesh using a relatively high frequency, low power illumination signal in order to activate the protection device. The frequency of the illumination signal may be approximately a resonant frequency of the discontinuous mesh based on cell size (e.g., spacing of conductive members of the discontinuous mesh). Thus, the illumination signal may have a wavelength on an order of about two times the cell size. Since the discontinuous mesh may be designed for a working signal (e.g., a signal that is allowed to pass through) with a wavelength on an order of about twenty-five times the cell size there may be little interference between the working signal and the illumination signal. Frequency of the illumination signal can also be chosen to be between harmonics of operating frequencies of an aperture associated with the protection device to avoid unwanted coupling of the aperture. When active modulation of the discontinuous mesh is used, polarization of the illumination signal may cause the screen to selectively block signals having a particular polarity. For example, depending on polarization of the illumination signal, either vertically or horizontally polarized incoming signals may be blocked.

A unit cell size of the discontinuous mesh may be selected to improve performance for particular incident signals. For example, the unit cell size may be selected to be much smaller than a wavelength of the particular incident signal to increase a reflection coefficient of the discontinuous mesh. A gap width of the discontinuous mesh can be selected to mitigate a specific threshold level of incident power. For example, larger gaps may be used to mitigate higher incident power levels. Additionally, multiple discontinuous mesh layers with varying gap widths can be used to mitigate a broader range of incident power levels. For example, two mesh layers may be used with a first layer having wider gaps than a second layer. The first layer may only turn on for relatively high incident power levels. The second layer may be activated for lower incident power levels, but may be overpowered by the higher incident power levels. Additionally, when the first layer is on top of the second layer, the second layer may be activated by "spill over" from the first layer, providing additional protection. That is, when a relatively high-power signal activates the first layer, a portion of the high-power signal may pass through the first layer. The portion of the high-power signal that passes through the first layer may be sufficient to activate the second layer, enabling the second layer to provide additional protection. Each layer may provide up to about 25 decibels of attenuation and up to about 18 decibels of dynamic operating range of the incident power level.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A method, comprising:
permitting a first signal having a first electromagnetic waveform to pass through an apparatus; and
blocking a second signal having a second electromagnetic waveform at the apparatus, wherein the second electromagnetic waveform is different than the first electromagnetic waveform;
wherein the apparatus comprises:
a non-conductive substrate;
a plurality of cells including conductive members coupled to the non-conductive substrate, wherein the conductive members are arranged to form a first discontinuous mesh, wherein regions between the conductive members of the first discontinuous mesh include a phase change material, wherein the phase change material undergoes a phase transition from substantially non-conductive to substantially conductive.

2. The method of claim 1, wherein the non-conductive substrate comprises a ceramic material, a polymer material, or a combination thereof.

3. The method of claim 1, wherein dimensions of the conductive members are selected to permit propagation of the first electromagnetic waveform and to block propagation of the second electromagnetic waveform.

4. The method of claim 3, wherein each cell of the plurality of cells is approximately square and has a length is approximately one-twenty-fifth of a first wavelength of the first electromagnetic waveform.

5. The method of claim 4, wherein the length is approximately one-half of a second wavelength of the second electromagnetic waveform.

6. The method of claim 1, wherein the apparatus further comprises second conductive members arranged to form a second discontinuous mesh, wherein the second discontinuous mesh is layered over or under the first discontinuous mesh, wherein the conductive members of the first discontinuous mesh are separated from each other by a first distance and the second conductive members of the second discontinuous mesh are separated from each other by a second distance, and wherein the second distance is different from the first distance.

7. The method of claim 1, wherein a gap is defined between the conductive members of the first discontinuous mesh at regions between the conductive members, and wherein the phase change material includes a gas that forms a plasma when the gas is excited by particular electromagnetic waveforms.

8. The method of claim 1, wherein the phase change material includes vanadium (IV) oxide.

9. A method, comprising:
permitting a first signal having a first electromagnetic waveform to pass through an apparatus to an electronic device when the apparatus is in a first operational state; and
selectively blocking a second signal from passing to the electric device when the electronic device is in a second operational state, the second signal having a second electromagnetic waveform that is different than the first electromagnetic waveform.

10. The method of claim 9, wherein the apparatus comprises:
a non-conductive substrate;
a discontinuous mesh of conductive members; and
a phase change material disposed between the conductive members of the discontinuous mesh, wherein to transition from the first operational state to the second operational state the phase change material undergoes a phase transition from substantially non-conductive to substantially conductive at least partially responsive to the second electromagnetic waveform.

11. The method of claim 9, further comprising transmitting a signal having the second electromagnetic waveform to cause the apparatus to transition to the second operational state.

12. The method of claim 11, wherein a time required to switch from the first operational state to the second operational state is about 2 nanoseconds or less.

13. The method of claim 12, wherein the time required to switch from the first operational state to the second operational state is less than one picosecond.

14. The method of claim 9, further comprising directing, by a second electronic device, a third signal having a third electromagnetic waveform toward the apparatus to cause a portion of the apparatus to undergo a phase transition to switch from the first operational state to the second operational state.

15. The method of claim 14, wherein the first electromagnetic waveform has a first polarization and further comprising selectively blocking a fourth signal having a second polarization responsive to the second electronic device directing the third signal toward the apparatus.

16. The method of claim 9, wherein a transition from the first operational state to the second operational state is a metal-insulator phase transition.

17. A method, comprising:
permitting a first signal having a first electromagnetic waveform to pass through an apparatus;
undergoing a phase transition at a portion of the apparatus responsive to a second signal having a second electromagnetic waveform; and
blocking the second signal having the second electromagnetic waveform at the apparatus responsive to undergoing the phase transition, wherein the second electromagnetic waveform is different than the first electromagnetic waveform.

18. The method of claim 17, wherein a wavelength of the second electromagnetic waveform is less than a first wavelength of the first electromagnetic waveform.

19. The method of claim 17, wherein a power of the second signal at the apparatus is greater than a first power of the first signal at the apparatus.

20. The method of claim 17, wherein the phase transition is a metal-insulator phase transition.

\* \* \* \* \*